(12) United States Patent
Ohmori et al.

(10) Patent No.: US 7,538,475 B2
(45) Date of Patent: May 26, 2009

(54) MULTILAYER PIEZOELECTRIC DEVICES AND METHOD OF PRODUCING SAME

(75) Inventors: Makoto Ohmori, Nagoya (JP); Kunihiko Yoshioka, Nagoya (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 113 days.

(21) Appl. No.: 11/602,778

(22) Filed: Nov. 21, 2006

(65) Prior Publication Data

US 2007/0164639 A1    Jul. 19, 2007

(30) Foreign Application Priority Data

Jan. 13, 2006    (JP) .............................. 2006-006484

(51) Int. Cl.
    *H01L 41/08*    (2006.01)
(52) U.S. Cl. .................. 310/328; 310/363; 310/364
(58) Field of Classification Search .................. 310/328, 310/366, 364
    See application file for complete search history.

(56) References Cited

U.S. PATENT DOCUMENTS

| | | | | |
|---|---|---|---|---|
| 5,406,164 | A * | 4/1995 | Okawa et al. ............... | 310/366 |
| 6,091,180 | A * | 7/2000 | Unami et al. ............... | 310/328 |
| 6,208,026 | B1 | 3/2001 | Bindig et al. | |
| 6,316,863 | B1 * | 11/2001 | Schuh et al. ................. | 310/328 |
| 6,411,018 | B1 | 6/2002 | Heinz | |
| 6,507,140 | B1 | 1/2003 | Heinz et al. | |
| 6,573,639 | B1 * | 6/2003 | Heinz et al. ................. | 310/363 |
| 6,731,050 | B2 * | 5/2004 | Bindig et al. ............... | 310/366 |
| 6,798,123 | B2 | 9/2004 | Bindig et al. | |
| 7,288,875 | B2 * | 10/2007 | Kadotani et al. ............ | 310/328 |
| 2001/0047796 | A1 | 12/2001 | Yamada et al. | |
| 2002/0043901 | A1 | 4/2002 | Kihara et al. | |

FOREIGN PATENT DOCUMENTS

| | | |
|---|---|---|
| DE | 197 53 930 | 6/1999 |
| DE | 199 28 190 | 1/2001 |
| DE | 101 63 358 | 8/2002 |
| EP | 1 162 671 | 12/2001 |
| JP | 07-22557 | 4/1995 |
| JP | 07-226541 A1 | 8/1995 |
| JP | 10-229227 A1 | 8/1998 |
| JP | 2002-171004 A1 | 6/2002 |
| JP | 2003-502869 A1 | 1/2003 |
| JP | 2003-502870 A1 | 1/2003 |
| JP | 2003-503859 A1 | 1/2003 |
| WO | WO 01/01499 A1 | 1/2001 |

* cited by examiner

*Primary Examiner*—Mark Budd
(74) *Attorney, Agent, or Firm*—Burr & Brown

(57) ABSTRACT

A multilayer piezoelectric device has a laminated body having piezoelectric layers laminated in the direction of a given axis "A" and positive and negative internal electrode layers are alternatively disposed between neighboring piezoelectric layers. The device further has a underlying layer disposed on a side of the laminated body and electrically connected to one of the internal electrode layers, a first conductive reinforcing layer joined to the underlying layer, a second conductive reinforcing layer joined to the first conductive reinforcing layer, and a conductive joining material joining the underlying layer to the first conductive reinforcing layer. The second conductive reinforcing layer is not directly joined to the underlying layer by means of the conductive joining material.

15 Claims, 11 Drawing Sheets
(1 of 11 Drawing Sheet(s) Filed in Color)

(a)

(b)

(a)

(b)

(a)

(b)

(c)

MULTILAYER PIEZOELECTRIC DEVICES AND METHOD OF PRODUCING SAME

This application claims the benefit of Japanese Patent Application P2006-6484 filed on Jan. 13, 2006, the entirety of which is incorporated by reference.

BACKGROUND OF THE INVENTION

1. Field of the Invention

The present invention relates to a multilayer piezoelectric device.

2. Description of the Prior Art

In diesel engines, a fuel is injected into each cylinder and compressed to a high pressure to induce autoignition, and the engine power output is controlled by adjusting the fuel injection level. Therefore, in diesel engines, the role of the fuel injection system which feeds the fuel into the cylinders is important. The increasing use of diesel engines in recent years is largely owing to the developments in so-called common-rail fuel injection system. The future increased use of diesel engines is expected to be backed up, in particular, by employing piezoelectric devices in lieu of solenoid devices as the drives for opening and closing injection nozzles. This is because piezoelectric devices can realize the opening and closing of injection nozzles more quickly and with higher precision than solenoid devices and, therefore, can feed more appropriate amounts of a fuel to cylinders with better timing. The best combustion conditions for the fuel can be thus established and thus provides marked effects as decreases in the amount of hazardous substances such as particulate matters, nitrogen oxides, carbon monoxide and hydrocarbons contained in the exhaust gas, fuel consumption improvement, engine noise reduction, and engine output improvement.

Piezoelectric devices applied to fuel injection systems has been utilized as power sources for driving injection nozzle opening and closing mechanisms generating displacements and stresses and are mostly used in a state of being contained in cases made of a metal or the like. Generally, multilayer ones are used as the piezoelectric devices.

In multilayer piezoelectric actuators comprising internal electrodes offset alternately, there are an active region (expanding and contracting regions) and inactive regions (regions neither expanding nor contracting) in the device inside. Great stresses thus build up at the boundaries between the active and the inactive regions, so that there is the possibility of stress-due cracking occurring and causing external electrode breaking as well. It is thus demanded that the durability of external electrodes be improved. For that purpose, it is conceivable to simply increase the strength of external electrodes to thereby prevent them from being cut apart. However, when the strength of external electrodes is high, the driving of the devices may be inhibited in some instances, with the result that the displacement efficiency may be reduced.

Japanese Patent (Kokai) Publication No. H07-226541A describes that a underlying layer for the external electrodes is bridged to secure conduction.

Japanese Patent (Kokai) Publication No. H10-229227A describes that a single-layer reinforcement layer is joined to the external electrodes in offset type devices.

The following documents also describe the joining of external electrode reinforcing layer in offset type devices:

Japanese Unexamined Patent (Kohyo) Publication No. 2003-502869A;

Japanese Unexamined Patent (Kohyo) Publication No. 2003-502870A;

Japanese Unexamined Patent (Kohyo) Publication No. 2003-503859A;

Japanese Unexamined Patent (Kokai) Publication No. 2002-171004A.

SUMMARY OF THE INVENTION

However, in view of the recent miniaturization requirement for the devices, it is necessary to further improve the displacement efficiency of the devices upon voltage application and, for that purpose, it is necessary to reduce a constraining force of the external electrodes as exerted on piezoelectric layers. For reducing the constraining force of the external electrodes onto the piezoelectric layers, however, it is necessary to lower the Young's modulus of the external electrodes to thereby facilitate deformation. In this case, there arises an antinomy, namely the devices tend to be readily broken upon a large number of repetitions of expansion and contraction.

For reducing the constraining force of the external electrodes against piezoelectric bodies, it is effective to lower the Young's modulus of the whole external electrode system. Thus, the constraining force of the external electrodes onto the piezoelectric bodies can be reduced by using a flexible material in making the external electrodes or softly joining the external electrodes to the piezoelectric body. However, when the constraining force from the external electrodes to the piezoelectric body is reduced, the reliability of the joining sites of the external electrodes to the piezoelectric body tends to be deteriorated after a large number of repetitions of expansion and contraction of the external electrodes; thus, there is an antinomy.

It is an object of the present invention to provide a multilayer piezoelectric device structure by which the displacement efficiency upon voltage application can be improved and the durability in repeated use can be improved.

The present invention provides a multilayer piezoelectric device comprising:

a laminated body comprising a plurality of piezoelectric layers laminated in the direction of a given axis and internal electrode layers each disposed between two respective neighboring piezoelectric layers;

a underlying layer disposed on a side face of the laminated body and electrically connected to the internal electrode layers;

a first conductive reinforcing layer joined to the underlying layer;

a second conductive reinforcing layer joined to the first conductive reinforcing layer; and a conductive joining material joining the underlying layer to the first conductive reinforcing layer. The second conductive reinforcing layer is free of direct joining by means of the conductive joining material.

In accordance with the present invention, the first conductive reinforcing layer is connected electrically to the underlying layer of the multilayer piezoelectric device, and the second conductive reinforcing layer is joined onto the first conductive reinforcing layer. Moreover, the overlying second conductive reinforcing layer remains free of joining by means of the conductive joining material.

Such a structure distinctly distinguishes the function of the first conductive reinforcing layer from that of the second conductive reinforcing layer. It is thus possible to successfully provide the two effects which are contradictory to each other, namely improvement in displacement efficiency and improvement in durability. Thus, by joining the first conductive reinforcing layer to the underlying layer by means of the conductive joining material, it becomes possible to exert a desired constraining force on the laminated body of the device. Since the second conductive reinforcing layer is free of direct joining with the conductive joining material, the constraining force value can be optimized through the designing of the first conductive reinforcing layer. At the same time, by providing the second conductive reinforcing layer with a sufficiently high level of strength, it becomes possible to secure the desired conduction even in such a situation that the underlying layer and the first conductive reinforcing layer undergo disconnection or show increased resistance values.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1:
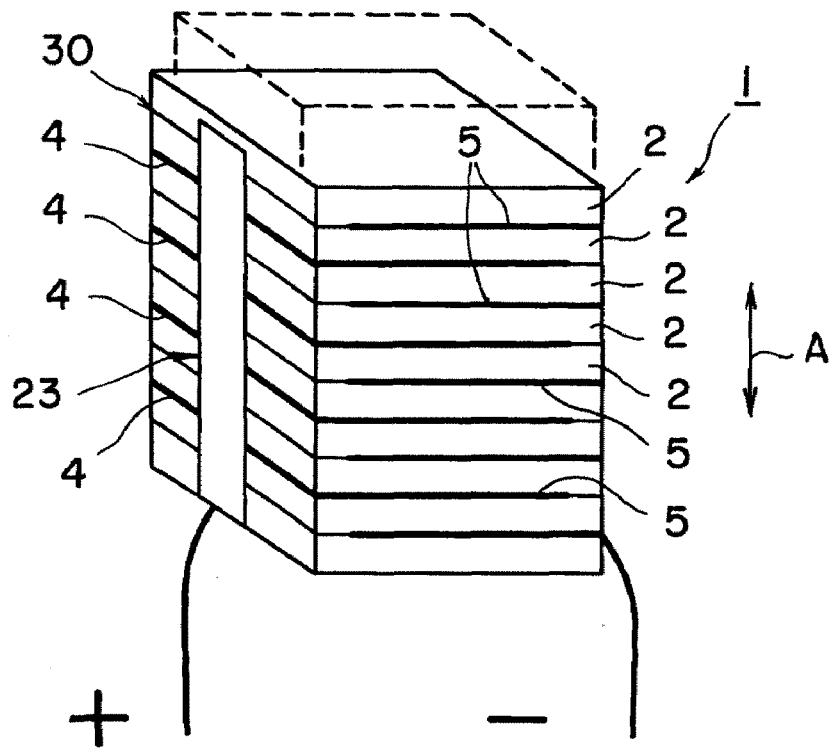
FIG. 1(a) is a perspective view schematically illustrating a laminated body 1.
FIG. 1(b) is an exploded perspective view of the respective piezoelectric layers and internal electrode layers.
Figure 1:
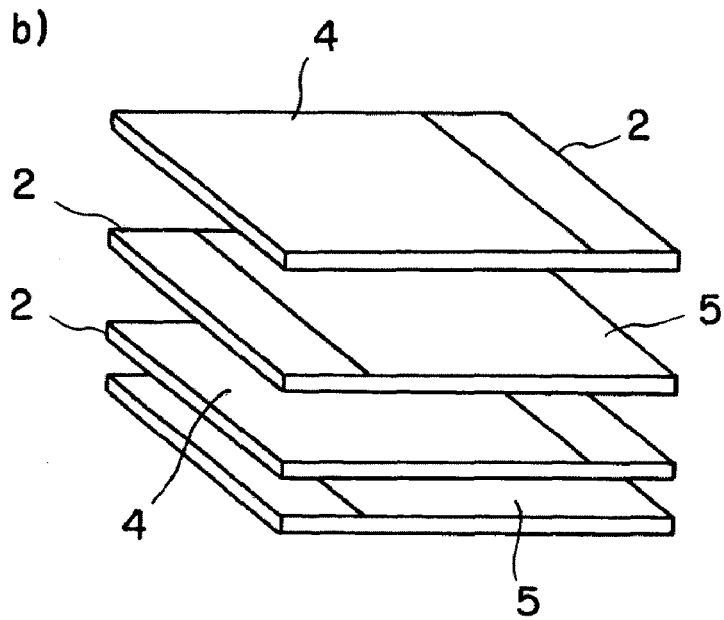

In accordance with the present invention, a laminated body is constructed by laminating a plurality of piezoelectric layers with one another in the direction of a given axis with internal electrode layers each disposed between the respective two neighboring piezoelectric layers. Here, the internal electrode layers are preferably disposed such that the internal electrode layer serving as a positive electrode and the internal electrode layer serving as a negative electrode come one after the other.

The displacement of the laminated body utilized in the device of the present invention includes all the displacements due to a strain induced in the piezoelectric body by an electric field. Thus, the device of the invention is not limited to the one utilizing the piezoelectric effect in a narrower sense thereof, namely the one utilizing the piezoelectric effect producing a strain approximately proportional to the intensity of the electric field applied, and to the one utilizing the electrostriction effect producing a strain approximately proportional to the square of the intensity of the electric field applied. The device also includes those utilizing such phenomena as polarization inversion generally observed in ferroelectric materials and antiferroelectric phase-ferroelectric phase transition observed in antiferroelectric materials.

The laminated body constituting the device of the invention can be manufactured by the green sheet lamination method and simultaneous punching/lamination method, although the manufacturing method is not limited thereto. An electrode pattern made of a conductive material is formed on each of green sheets mainly made of a piezoelectric material, green sheets with the electrode pattern formed thereon are punched while laminating them on the punch of a punching machine utilizing the punch as the lamination axis. The thus-obtained green laminated body is fired to give a columnar laminated body integrated by firing.

For example, FIG. 1(a) shows a schematic perspective view of a laminated body 1 utilizable in producing the device of the invention, and FIG. 1(b) shows a perspective view showing the pattern of internal electrode layers on the respective piezoelectric layers. FIG. 2(a) is a schematic longitudinal sectional view of the laminated body, and FIG. 2(b) is a schematic transverse sectional view of the laminated body of FIG. 2(a).

In this example, a number of piezoelectric layers 2 are piled up in the direction of the given axis "A", and an internal electrode layer 4 or 5 is formed between each pair of neighboring piezoelectric layers 2. A plus polarity voltage is applied to each internal electrode layer 4, whereas a minus polarity voltage is applied to each internal electrode layer 5. The internal electrode layers 4 and 5 are formed alternately and, as shown in FIG. 1(b), the internal electrode layers 4 and 5 differ in the planar patterns from each other. This kind of device is called "offset multilayer piezoelectric device". It is to be noted, however, that the present invention is not limited to such offset multilayer piezoelectric devices. Each internal electrode layer 4 is electrically connected to an electrode structure 23, and each internal electrode layer 5 is electrically connected to another electrode structure 27. Each electrode structure will be described later herein.

In producing such laminated body, the green sheet lamination method and simultaneous punching/lamination method are preferably utilized. First, a predetermined number of ceramic-made green sheets mainly made of a piezoelectric/electrostriction material are prepared. These ceramic green sheets constitute piezoelectric layers after firing. Such ceramic green sheets can be prepared by those ceramic manufacturing methods known in the art. For example, powder of a piezoelectric/electrostriction material is prepared, an organic resin (binder), a solvent, a dispersant and a plasticizer, among others, are admixed therewith according to a desired formulation, the thus-prepared slurry is subjected to degassing treatment. The slurry is then molded by such a tape forming method as the doctor blade method, reverse roll coater method or reverse doctor roll coater method, and the thus formed tape is cut, whereby the desired sheets can be prepared.

The piezoelectric (electrostriction) material is not particularly restricted but may be any material capable of causing an electric field-induced strain. It may be either crystalline or noncrystalline, and it is also possible to use semiconductor ceramic materials, ferroelectric ceramic materials or antiferroelectric ceramic materials. The material may be properly selected for utilization according to the intended use. The material may be one requiring polarization treatment or one not requiring polarization treatment.

As specific examples, there may be mentioned lead zirconate, lead titanate, lead magnesium niobate, lead nickel niobate, lead nickel tantalate, lead zinc niobate, lead manganese niobate, lead antimony stannate, lead manganese tungstate, lead cobalt niobate, lead magnesium tungstate, lead magnesium tantalate, barium titanate, sodium bismuth titanate, bismuth neodymium titanate (BNT), sodium niobate, potassium sodium niobate, strontium bismuth tantalate, barium copper tungstate, bismuth ferrate, and composite oxides composed of two or more of these. These materials may contain one or more of the oxide(s) of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper and so forth, each as a solute in the solid solution.

Among them, the following are preferred, since great electric field-induced strains can be utilized with them.

(1) Materials whose main component is a composite oxide comprising lead zirconate, lead titanate and lead magnesium niobate and which contain nickel oxide.

(2) Materials whose main component is a composite oxide comprising lead zirconate, lead titanate, lead magnesium niobate and lead nickel niobate.

In this case, materials whose nickel component content is 0.05-3% by mass as expressed in terms of nickel oxide are particularly preferred.

Further, materials derived from the above-mentioned materials and the like by addition of lithium bismuthate, lead germanate or the like are preferred, since they can show high-level material characteristics while realizing low-temperature firing of the piezoelectric/electrostriction layers containing them.

In particular, the following are preferred.

(3) The above-mentioned materials (1) whose main component is a composite oxide comprising lead zirconate, lead titanate or lead magnesium niobate and further containing nickel oxide. Each of the materials further contains 0.05-3% by mass of a nickel component as expressed in terms of nickel oxide and 0.3-4% by mass of lead germanate added thereto.

(4) The above-mentioned materials (2) whose main component is a composite oxide comprising lead zirconate, lead titanate, lead magnesium niobate or lead nickel niobate. Each of the materials further contains 0.05-3% by mass of a nickel component as expressed in terms of nickel oxide and 0.3-4% by mass of lead germanate added thereto.

Then, after preparation of a predetermined number of sheets, a conductor membrane having a predetermined pattern (electrode pattern) is formed on the surface of each sheet using a conductive material. This conductor membrane is a membrane to serve later as an internal electrode layer.

As for the means for conductor membrane formation, a screen printing method is preferably used. Such means as photolithography, transfer printing or stamping may also be used. Employed as the conductive material to be used are metals occurring as solids at room temperature. Preferably used are pure metals such as aluminum, titanium, chromium, iron, cobalt, nickel, copper, zinc, niobium, molybdenum, ruthenium, palladium, rhodium, silver, tin, tantalum, tungsten, iridium, platinum, gold and lead, and alloys composed of two or more of these, for example silver-platinum, platinum-palladium and silver-palladium, either singly or in combination of two or more species. Mixtures or cermets resulting from admixing the materials mentioned above with aluminum oxide, zirconium oxide, titanium oxide, silicon oxide, cerium oxide, glass, or a piezoelectric/electrostriction material, for instance, may also be used. The conductive material is selected from among these materials depending on whether it can be fired simultaneously with the piezoelectric/electrostriction layers. In the case of internal electrode layers, they are fired simultaneously with the piezoelectric/electrostriction layers and, therefore, it is necessary to use a high-melting metal which will not change or melt at the temperature for firing the piezoelectric/electrostriction layers, for example platinum, palladium, a platinum-palladium alloy or a silver-palladium alloy. On the other hand, in the case of the conductor layers to serve later as underlying layers, they are formed after firing of the laminated body and therefore can be fired at a lower temperature as compared with the temperature for firing the piezoelectric body. Thus, it is possible to use aluminum, gold, silver, silver-palladium alloys, silver-platinum alloys, copper, nickel and the like.

Then, a predetermined number of sheets each with a conductor membrane to later serve as an internal electrode layer as formed thereon are subjected to punching processing using a punching machine with the clearance between the punch and die properly adjusted, while laminating the processed sheets on the punch utilizing the punch as the lamination axis, as already mentioned hereinabove. The resulting sheets are then laminated with pressure bonding to give a green laminated body. This green laminated body is fired to give an integrated laminated (Wired) body.

According to the invention, a conductive underlying layer is disposed on each or both of the two side or lateral faces 30 of the laminated body (cf. FIG. 1), and the underlying layers are electrically connected to the corresponding internal electrodes. By saying the side faces 30 of a laminated body, it is meant that the plane of the side face is substantially parallel to the direction "A" of expansion and contraction of the piezoelectric body. The normal line of the side face is substantially perpendicular to the direction "A". A first conductive reinforcing layer and a second conductive reinforcing layer are combined together and the combined reinforcement layer assembly is joined onto each underlying layer formed on the fired piezoelectric body. In this case, care is taken so that the second conductive reinforcing layer may not be joined by means of the conductive joining material.

As for the means of forming the underlying layers, the screen printing method is properly used but such means as photolithography, transfer or stamping may also be used. Employed as the conductive material to be used are metals occurring as solids at room temperature. Preferably used are pure metals such as aluminum, titanium, chromium, iron, cobalt, nickel, copper, zinc, niobium, molybdenum, ruthenium, palladium, rhodium, silver, tin, tantalum, tungsten, iridium, platinum, gold and lead, and alloys composed of two or more of these, for example silver-platinum, platinum-palladium and silver-palladium, either singly or in combination of two or more species. Mixtures or cermets resulting from admixing the materials mentioned above with aluminum oxide, zirconium oxide, titanium oxide, silicon oxide, cerium oxide, glass, or a piezoelectric/electrostriction material, for instance, may also be used.

Figure 3:
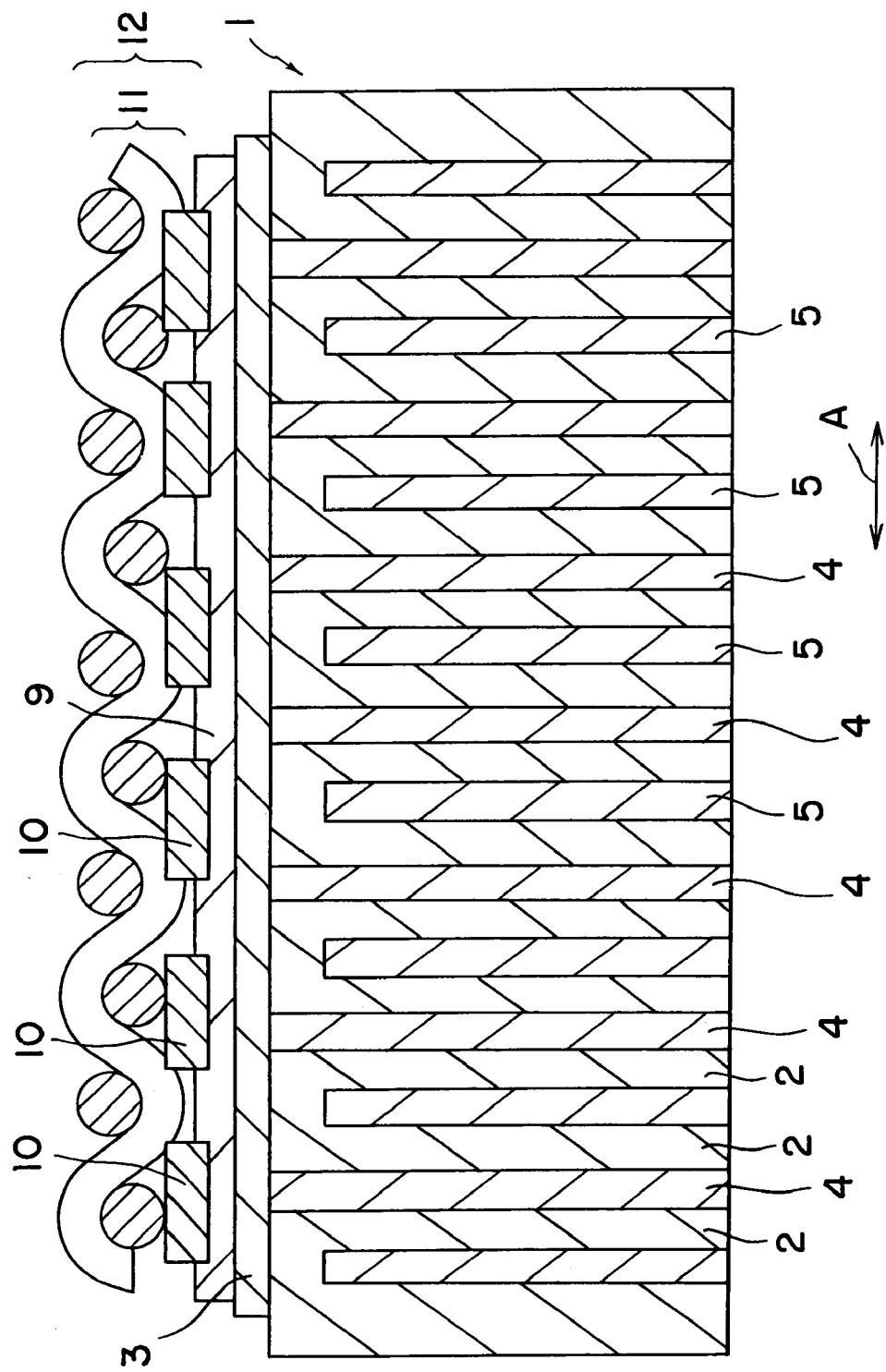
FIG. 3 is a cross-sectional view showing the principal portions of the device according to an embodiment of the invention.

FIG. 3 is a cross-sectional view showing the principal portions of a device according to an embodiment of the invention. As mentioned above, the laminated body 1 comprises a number of piezoelectric layers 2 laminated in the direction of the arrow "A". An internal electrode layer 4 or 5 is formed between each pair of neighboring piezoelectric layers. Each internal electrode layer 4 is electrically connected to the underlying layer 3. The underlying layer 3 is joined to the first conductive reinforcing layer 10 by means of the conductive joining material 9, and the first conductive reinforcing layer 10 is joined to the second conductive reinforcing layer 11. A composite conductive reinforcing layer 12 is formed by the first conductive reinforcing layer and the second conductive reinforcing layer. The second conductive reinforcing layer 11 is not wetted with the conductive joining material 9 and therefore is not directly joined to the underlying layer.

The method of joining the first conductive reinforcing layer and the second conductive reinforcing layer together is not particularly restricted. Preferably, both layers are combined by welding, diffusion bonding or brazing or by using a conductive adhesive. Such methods of bonding are well known in the field of metal processing.

In a preferred embodiment, each first conductive reinforcing layer is made of a sheet-shaped metal. Thereby, the first conductive reinforcing layer can be made relatively thin and the constraining force can be reduced, so that the laminated body can show an increased displacement. For increasing the displacement of the device, the first conductive reinforcing layer is preferably not thicker than 500 μm, more preferably not thicker than 250 μm. When, however, the first conductive reinforcing layer is excessively thin, disconnection or cutting apart may occur readily; therefore, the layer is preferably not thinner than 10 μm, more preferably not thinner than 30 μm.

The first conductive reinforcing layer may be a sheet-like matter substantially lacking in elasticity. In this case, the displacement of the laminated body can be increased by further reducing the thickness of the sheet-like matter.

In a preferred embodiment, the sheet-like matter constituting the first conductive reinforcing layer is made of an expanded metal, punched metal or etched metal.

The material constituting the first conductive reinforcing layer is not particularly restricted but may be any of the materials having desired levels of Young's modulus, strength and conductivity. Preferably, the material of the first conductive reinforcing layer comprises at least one metal selected from the group consisting of Ni, Cu, Fe, Cr, Ti, Mg, Al, Ag, Pd, Pt and Au, and the alloys of these. Among them, the following are particularly preferred: from the cost viewpoint, Ni, Cu and Ti are desirable. Cu, which is a material low in Young's modulus and low in resistance, can be said to be an excellent material.

The shape of the second conductive reinforcing layer is not particularly restricted but, from the viewpoint of increasing the displacement of the laminated body, a net-like material is preferred. The material of the second conductive reinforcing layers is not particularly restricted but may be any of those materials with which desired levels of Young's modulus, strength and conductivity can be realized. Thus, preferably, the material comprises at least one metal selected from the group consisting of Ni, Cu, Fe, Cr; Ti, Mg, Al, Ag, Pd, Pt and Au, and the alloys of these.

The percentage open area of the first conductive reinforcing layer is preferably larger than that of the second conductive reinforcing layer. Thereby, it becomes possible to reduce the constraint of the laminated body by the first conductive reinforcing layer and thereby increase the displacement. Further, it becomes easy to secure the electric conduction by the second conductive reinforcing layer in case of the first conductive reinforcing layer being disconnected or showing an increased resistance value. From this viewpoint, the difference in percentage open areas between the first conductive reinforcing layer and second conductive reinforcing layer is preferably not smaller than 5%, more preferably not smaller than 10%.

From the viewpoint of increasing the displacement of the laminated body, the percentage open area of the first conductive reinforcing layer is preferably not smaller than 40%, more preferably not smaller than 50%. From the viewpoint of securing the conduction, the percentage open area of the first conductive reinforcing layer is preferably not larger than 75%.

From the viewpoint of increasing the displacement of the laminated body, the percentage open area of the second conductive reinforcing layer is preferably not smaller than 10%, more preferably not smaller than 25%. From the viewpoint of securing the conduction, the percentage open area of the second conductive reinforcing layer is preferably not larger than 60%.

In a preferred embodiment, the area of the conductive joining material is made larger than that of the first conductive reinforcing layer.

The material constituting the conductive joining material is not particularly restricted but may be any of the materials capable of joining the first conductive reinforcing layer. Preferably, the material comprises at least one metal selected from the group consisting of Sn, Pb, Cu, Ag, Au, In, Ga and Al, and the alloys thereof. Particularly preferred are the materials mentioned below.

Thus, mention may be made of solder alloys derived from Sn—Pb eutectic alloys doped with Ag and of such Pb-free solders as Sn-3Ag-0.5Cu, Sn-8Zn-3Bi and Sn-7Zn-0.003Al alloys. In particular, Sn-3Ag-0.5Cu alloy is desirable in view of its high connection reliability. More specifically, the material M705 (inventory number) available from Senju Metal Industry Co., Ltd. is preferred.

In accordance with the present invention, the second conductive reinforcing layers are each substantially free of joining by the conductive joining material. This situation includes the following two forms.

(1) A gap is provided between the second conductive reinforcing layer and the conductive joining material to thereby prevent the second conductive reinforcing layer from coming into direct contact with the conductive joining material. In this case, the gap size is not particularly restricted but is preferably not smaller than 30 μm. It is allowable that the second conductive reinforcing layer partly come into contact with the conductive joining material due to production process-related errors. Further, in this case, the second conductive reinforcing layer is made of a material hardly wettable with the conductive joining material or of a material wettable with the conductive joining material.

(2) The second conductive reinforcing layer is made of a material non-wettable or hardly wettable with the conductive joining material. An example of such combination is given below.

(Second conductive reinforcing layer: conductive joining material)=(stainless steel (SUS304) mesh: Sn-3Ag-0.5Cu alloy solder).

In a preferred mode of embodiment, at least 10% but not larger than 70% of the surface area of the conductive reinforcing layer is in contact with the conductive joining material. By contacting at least 10% of the surface area of the conductive reinforcing layer with the conductive joining material, it becomes possible to make the adhesion firm and to prevent the first conductive reinforcing layer from peeling off. By contacting not larger than 50% of the surface area of the conductive reinforcing layer with the conductive joining material, it becomes possible to increase the displacement of the laminated body.

In a preferred embodiment, the second conductive reinforcing layer is joined to the first conductive reinforcing layer at points of intersection of the first conductive reinforcing layer. Thereby, it is possible to make firm the joining of the second conductive reinforcing layer to the first conductive reinforcing layer and thereby prevent falling off or peeling off and, further, secure the conduction in case of disconnection.

Figure 4:
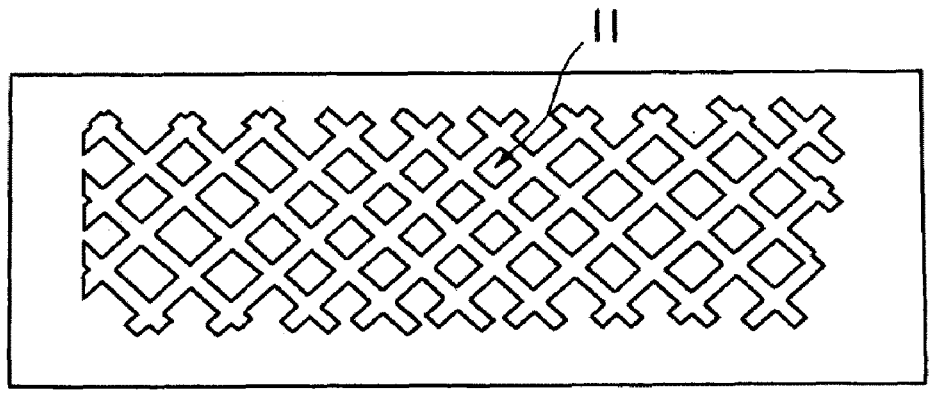
FIG. 4(a) is a schematic plan view illustrating a second conductive reinforcing layer 11.
FIG. 4(b) is a schematic plan view illustrating a first conductive reinforcing layer 10.
FIG. 4(c) is a schematic plan view of a composite conductive reinforcing layer 12.
Figure 4:
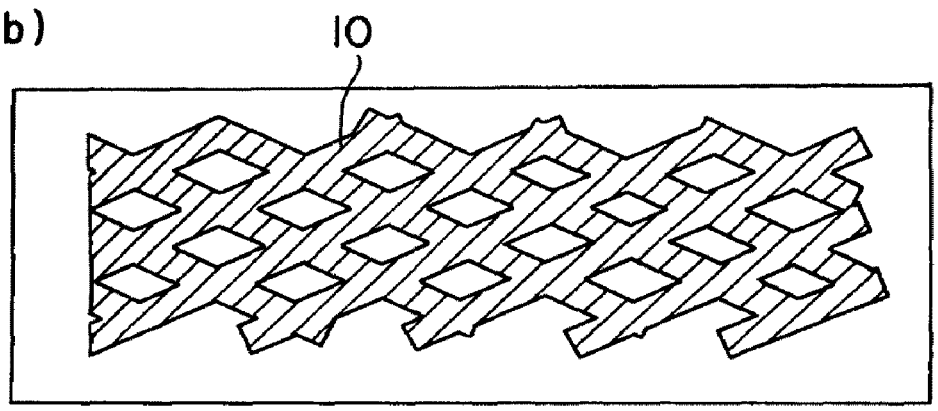
Figure 4:
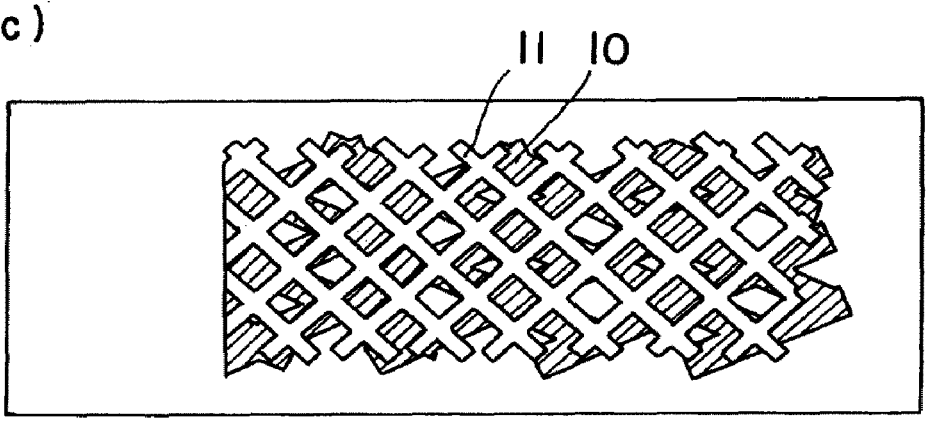

For example, FIG. 4(a) is a plan view showing a net-like matter 11 constituting the second conductive reinforcing layer, and FIG. 4(b) is a plan view showing an expanded metal (or punched metal) 10 constituting the first conductive reinforcing layer. As shown in FIG. 4(c), the second conductive reinforcing layer 11 is placed on the first conductive reinforcing layer 10 and the both are joined together to prepare a composite conductive reinforcing layer 12. On that occasion, the first conductive reinforcing layer 10 is joined to the second conductive reinforcing layer 11 at the points of intersection of the first conductive reinforcing layer 10.

Figure 5:
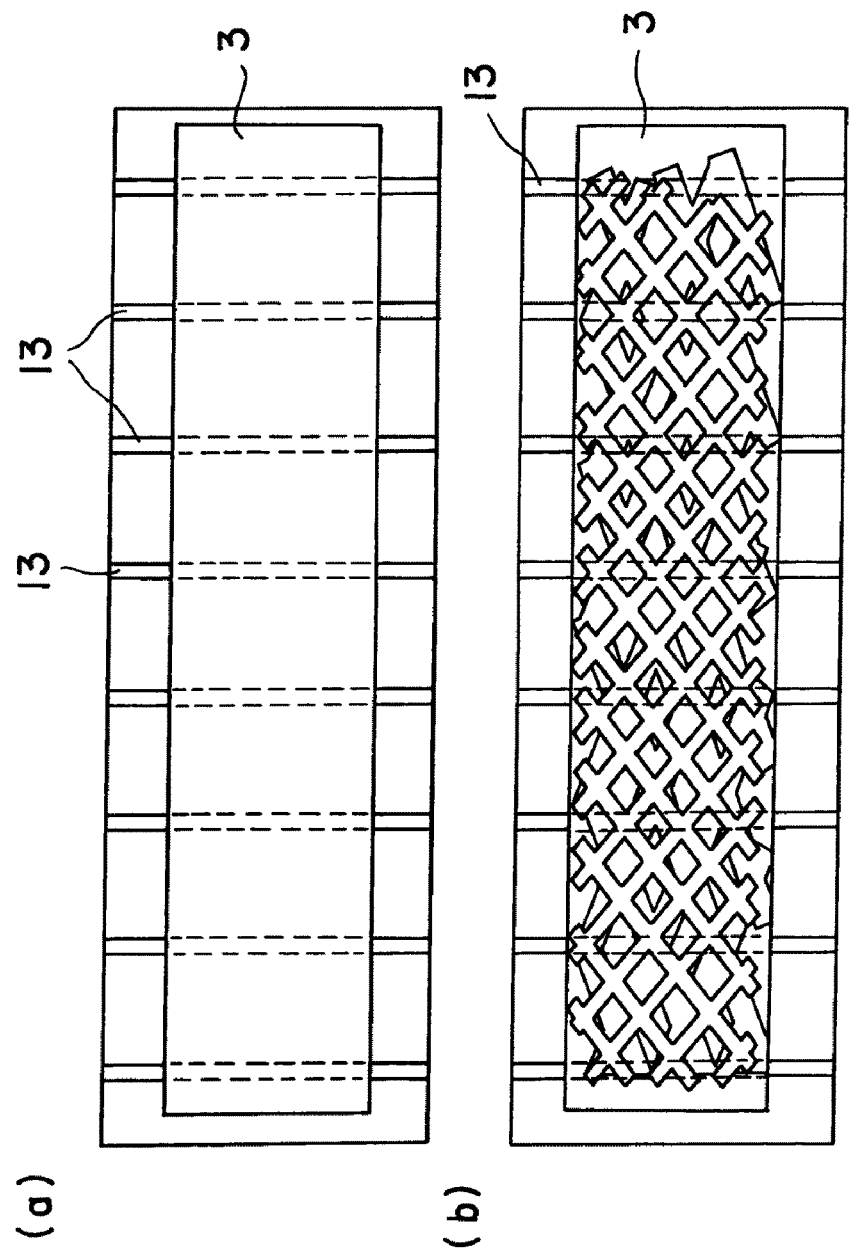
FIG. 5(a) is a plan view illustrating a underlying layer 3 and conductor connecting sites 13 of internal electrode layers.
FIG. 5(b) is a plan view illustrating a composite conductive reinforcing layer laid on the underlying layer shown in FIG. 5(a).

As shown in FIG. 5(a), conductor connecting sites 13 connected to respective internal electrode layers 4 are exposed on a side of the laminated body 1 and the conductor connecting sites 13 are connected to the underlying layer 3. The composite conductive reinforcing layer 12 is placed on and joined to the underlying layer 3, as shown in Fig. 5(b).

Figure 6:
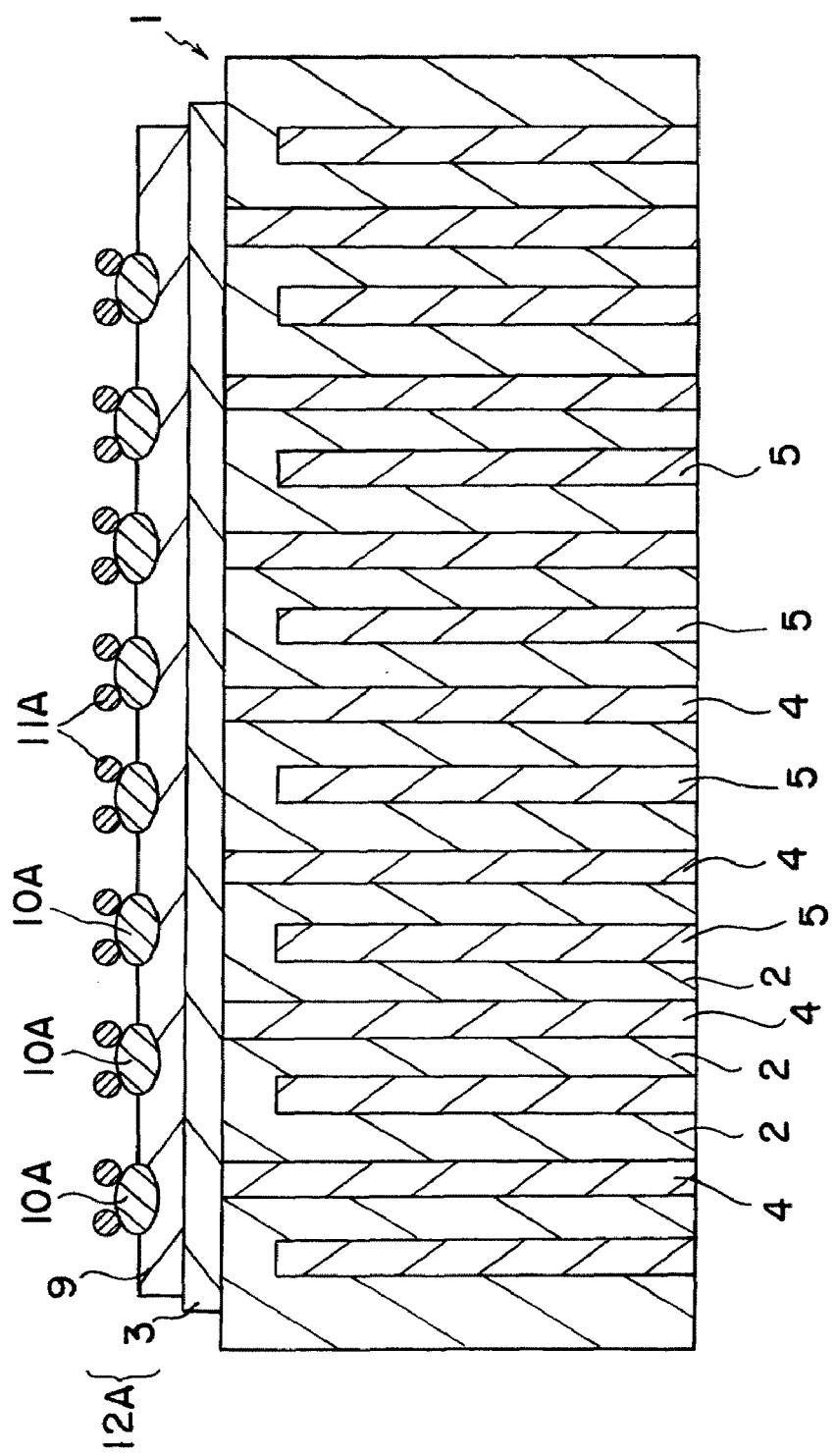
FIG. 6 is a cross-sectional view showing the principal portions of the device according to another embodiment of the invention.

In the example shown in FIG. 6, the underlying layer 3 is joined to the first conductive reinforcing layer 10A via the conductive joining material 9, and the first conductive reinforcing layer 10A is joined to the second conductive reinforcing layer 11A. A composite conductive reinforcing layer 12A is formed by the first conductive reinforcing layer 10A and second conductive reinforcing layer 11A. The second conductive reinforcing layer 1A is not wetted with the conductive joining material 9; therefore, it is not directly joined to the underlying layer 3.

The device according to the invention is applicable as a multilayer capacitor, a multilayer piezoelectric device or the like. Multilayer capacitors are capacitors currently used most frequently, in most of electric and electronic circuits in various kinds of products. They are suited for use, for example, in computers, communications apparatus, or portable terminal units, such as cellular phones, which are required to be small in size and light in weight. The multilayer piezoelectric device is used as a piezoelectric device such as a sensor or actuator in a measurement apparatus, optical modulator, optical switch, electric switch, microrelay, microvalve, transport mechanism, display, projector or like image display device, image drawing device, micropump, liquid drop discharging device, micromixer, microstirrer or microreactor, for instance.

The device of the invention is used as a favorable driving source for actuating an injection nozzle opening/closing mechanism in a fuel injection system. It is also applied as a driving source for an apparatus requiring precise positioning, such as an optical apparatus, or for vibration control equipment.

EXAMPLES

Example 1

Figure 2:
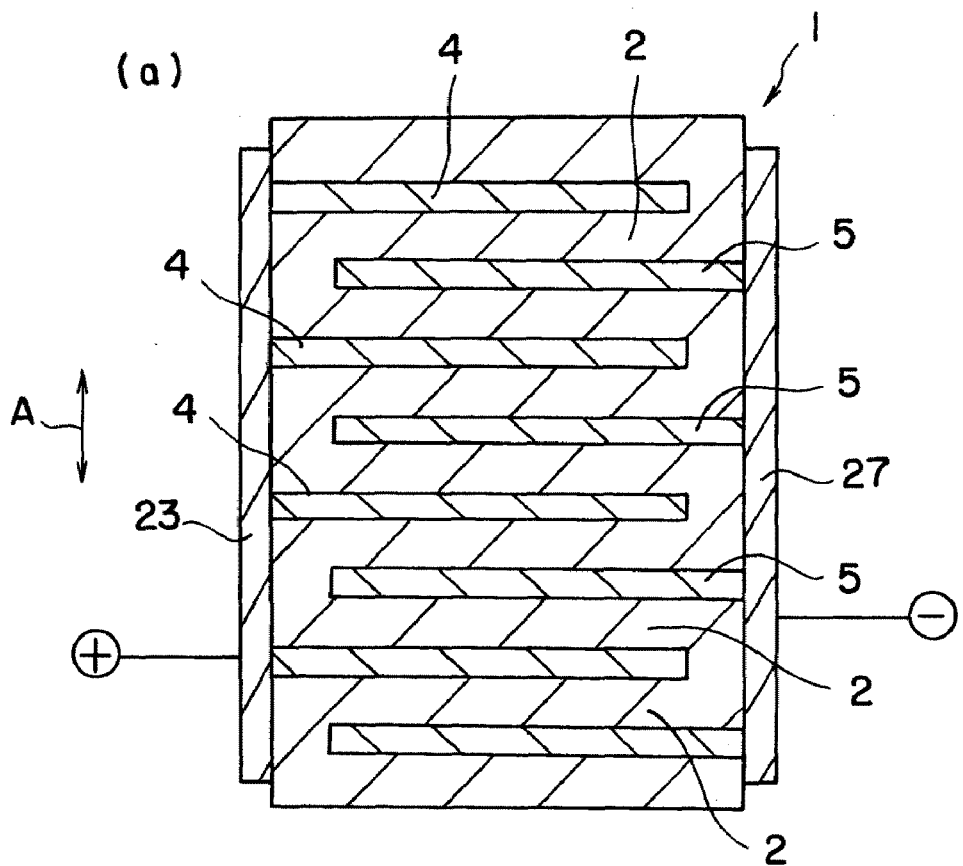
FIG. 2(a) is a schematic longitudinal sectional view of the laminated body 1.
FIG. 2(b) is a schematic transverse sectional view of the laminated body 1.
Figure 2:
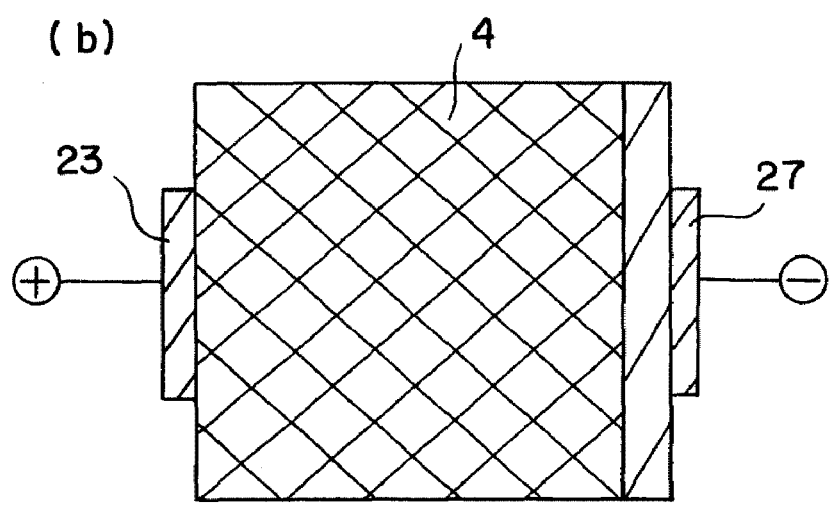

A device shown in FIGS. 1-3 was constructed. Specifically, 300-350 layers for constituting an active region and 50 layers each for constituting the upper or lower inactive regions were integrated by lamination. An internal electrode layer (e.g. 3 µm in thickness) was printed on each section of a piezoelectric tape and an adhesive layer (e.g. 5 µm in thickness) with an increased binder content as compared with the tape was printed thereon, and the layers were integrated by heating at 80° C. and weighting at 2 MPa.

The thus-integrated laminated molding was degreased at 600° C. and fired at 900-1100° C. to give a laminated piezoelectric ceramics body. This laminated body was cut and ground smooth to give a laminated body having a desired shape. The cross-section of the laminated body was 7 mm×7 mm in size and the length thereof was 35 mm. A underlying layer 3 to serve as an external electrode was formed on each of two sides of the device with offset electrode layers drawn out. In this example, a fired AgPd membrane was bound to each side by baking at 800° C.; the thickness of the membrane baked was 20 µm.

As a member for reinforcing each external electrode, a multilayer mesh member was joined to each underlying layer. Thus, a multilayer mesh 12 was prepared by integrating an expanded metal 10 made of Cu and a SUS mesh 11 by diffusion bonding and joined to the underlying layer 3 using a solder 9. Used as the solder was a Sn—Ag—Cu alloy-based Pb-free solder, and the joining was carried out under the conditions of 240° C. and 5 minutes.

Then, the whole device was coated with an insulating resin. Specifically, the device was selectively coated by applying an epoxy resin and a fluororesin. The resin thickness was 20-100 µm.

Then, the device was polarized. Specifically, a DC voltage of 150 V was applied for 10 minutes and then a DC voltage of 240 V for 10 minutes, in a condition heated at 170° C., to complete the polarization. The intensities of the electric fields on that occasion corresponded to 1.9 kV/mm and 3.0 kV/mm, respectively.

The device was actuated by applying a voltage of 200 V under a preload of 750 N. The waveform applied was 0.12 msec in rise time, 1 msec in keep time and 0.12 msec in fall time. The displacement of the device that could be attained was 50 µm. The multilayer reinforcing layer structure according to the invention made it possible to reduce the constraining force of each external electrode, and the element obtained was excellent in durability. Even after 1 billion cycles, no breakage was observed.

Comparative Example 1

Figure 7:
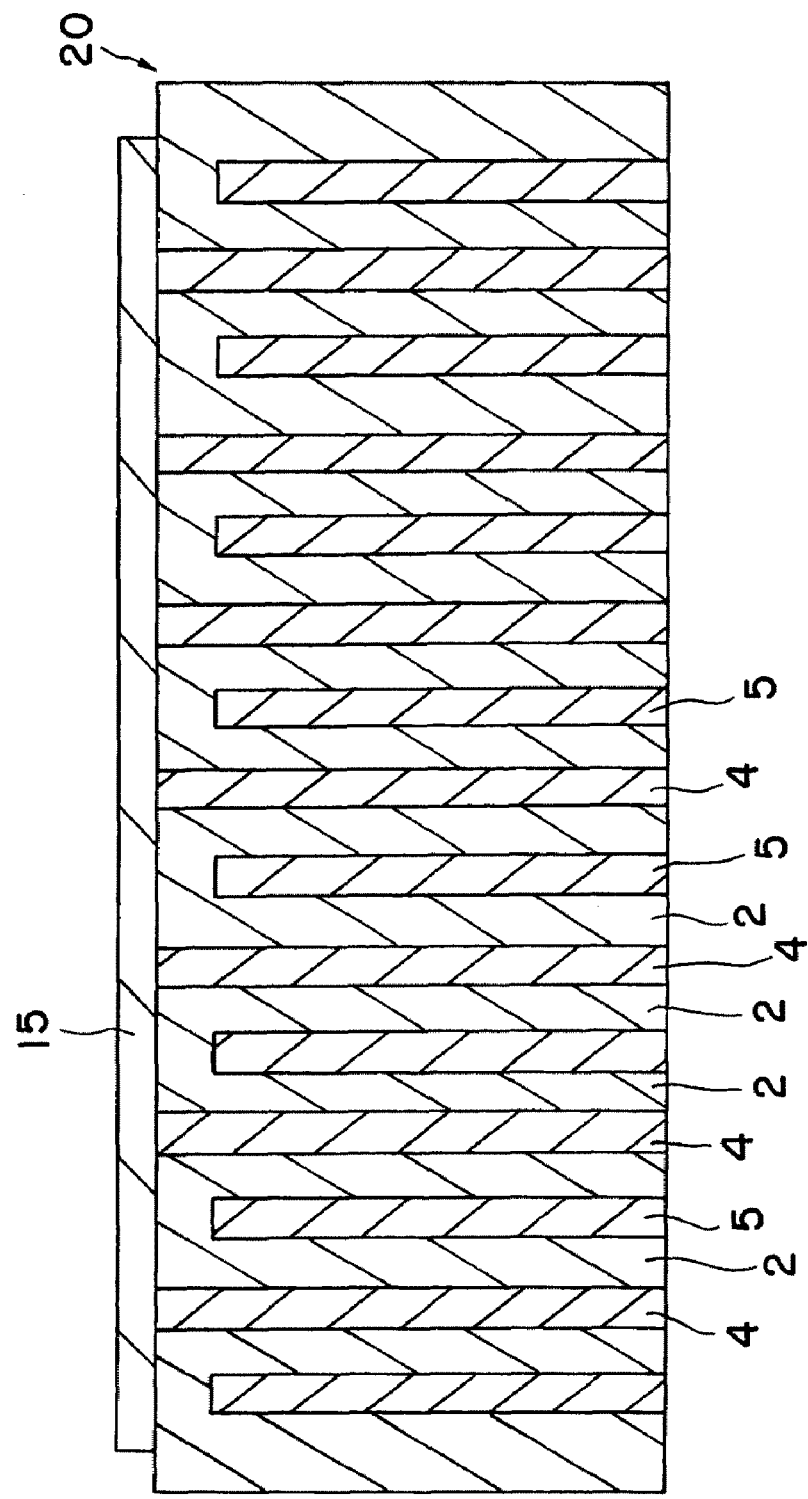
FIG. 7 is a cross-sectional view of a device 20 in a comparative example.

A device 20 schematically shown in FIG. 7 was constructed. Specifically, 300-350 layers for constituting an active region and 50 layers each for constituting the upper or lower inactive region were integrated by lamination. An internal electrode layer (e.g. 3 µm in thickness) was printed on each section of a piezoelectric tape and an adhesive layer (e.g. 5 µm in thickness) with an increased binder content as compared with the tape was printed thereon. The layers were integrated by heating at 80° C. and weighting at 2 MPa.

The thus-integrated laminated molding was degreased at 600° C. and fired at 900-1100° C. to give a laminated piezoelectric ceramics body. This laminated body was cut and ground smooth to give a laminated body having a desired shape. The cross-section of the laminated body was 7 mm×7 mm in size and the length thereof was 35 mm. A underlying layer 15 to serve as an external electrode was formed on each of two sides of the device with offset electrode layers drawn out. In this example, a fired AgPd membrane was bound to each side by baking at 800° C.; the thickness of the membrane baked was 20 µm. No external electrode reinforcing member was joined to the element.

Then, the whole device was coated with an insulating resin. Specifically, the device was selectively coated by applying an epoxy resin and a fluororesin. The resin thickness was 20-100 μm.

Then, the element was polarized. Specifically, a DC voltage of 150 V was applied for 10 minutes and then a DC voltage of 240 V for 10 minutes, in a condition heated at 170° C., to complete the polarization. The intensities of the electric fields on that occasion corresponded to 1.9 kV/mm and 3.0 kV/mm, respectively.

The device was actuated by applying a voltage of 200 V under a preload of 750 N. The waveform applied was 0.12 msec in rise time, 1 msec in keep time and 0.12 msec in fall time. The displacement of the device that could be attained was 50 μm. After 10 thousand actuation cycles, cracking occurred within the device and one of the external electrode layers was cut apart thereby, and the element stopped functioning.

Comparative Example 2

Figure 8:
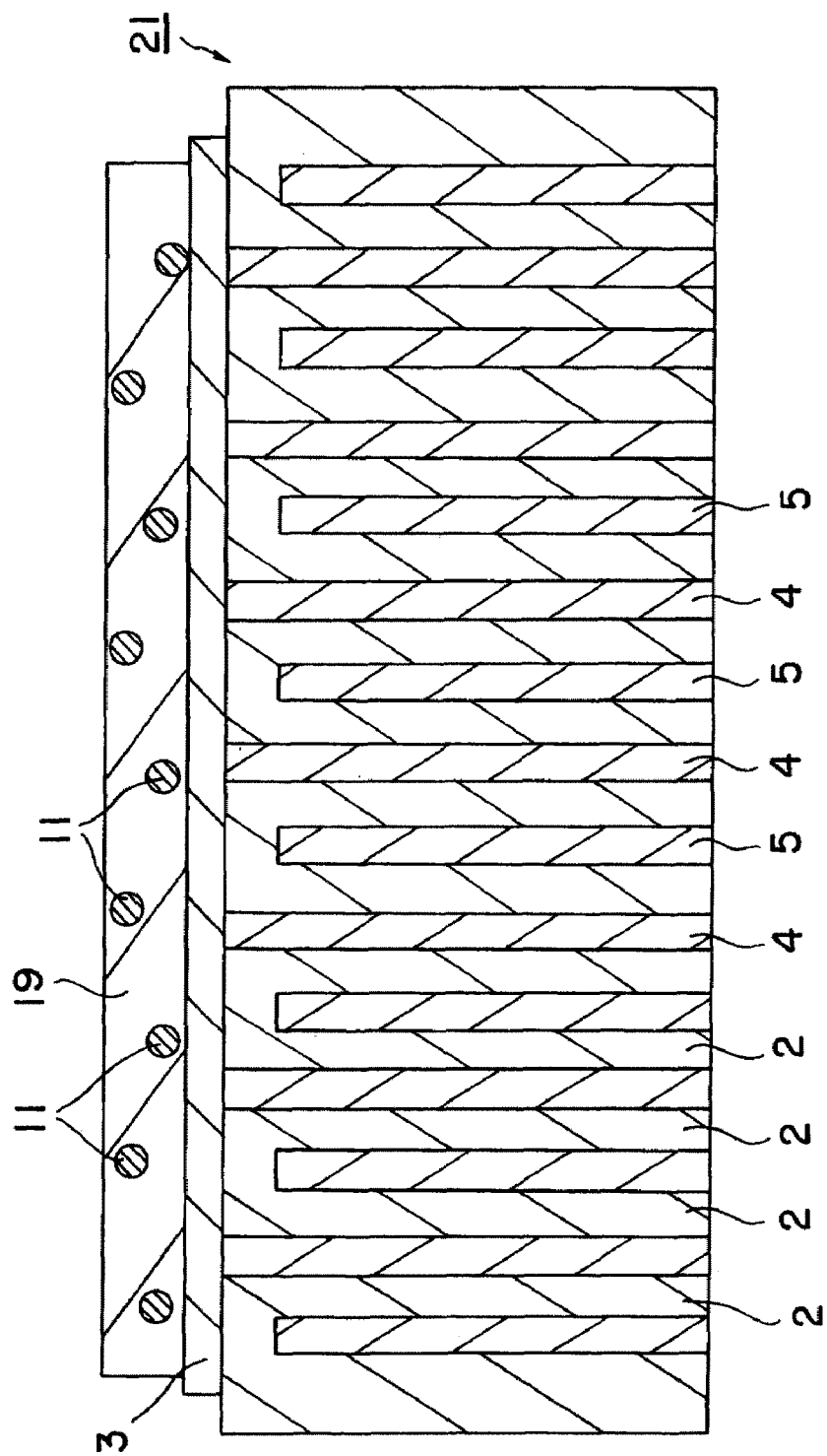
FIG. 8 is a cross-sectional view of a device 21 in another comparative example.

A device shown in FIG. 8 was constructed. Specifically, a laminated body 1 and underlying layers 3 were formed in the same manner as in Comparative Example 1. Then, a SUS mesh 11 was joined to each underlying layer 3 by soldering. However, the form of joining was such that the SUS mesh 11 was embedded in the solder 19.

As a result, the force of constraint of the device as exerted by the meshes 11 and the joining layers 19 was great, and the displacement was slightly reduced. After 3 million cycles, one external electrode was cut apart together with the SUS mesh embedded, and the device stopped functioning.

Figure 9:
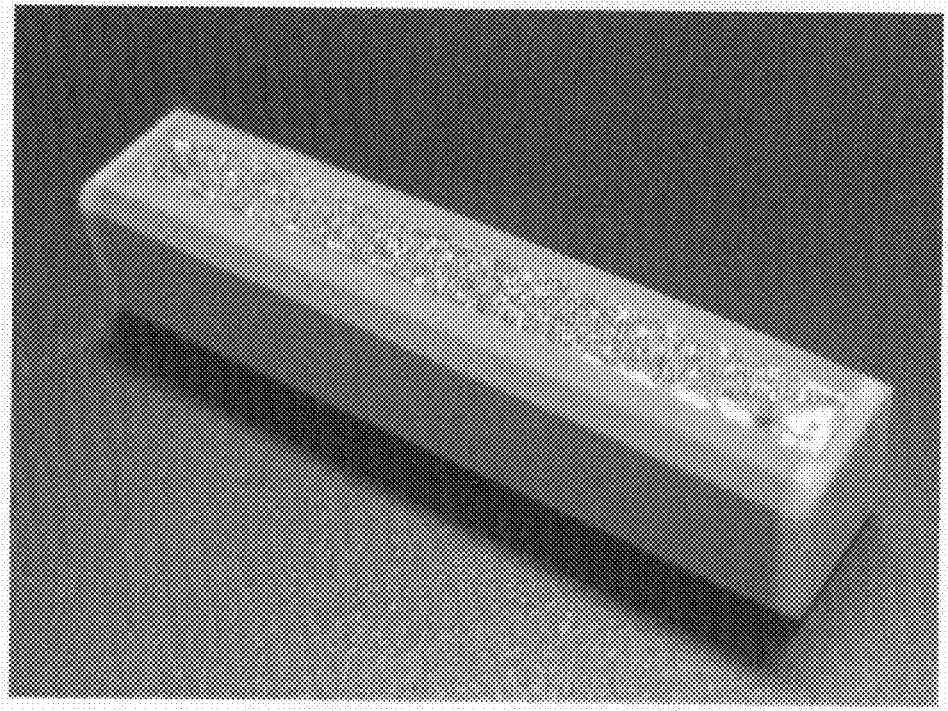
FIG. 9 is a color photograph showing the appearance of the device constructed in Example 1.
Figure 10:
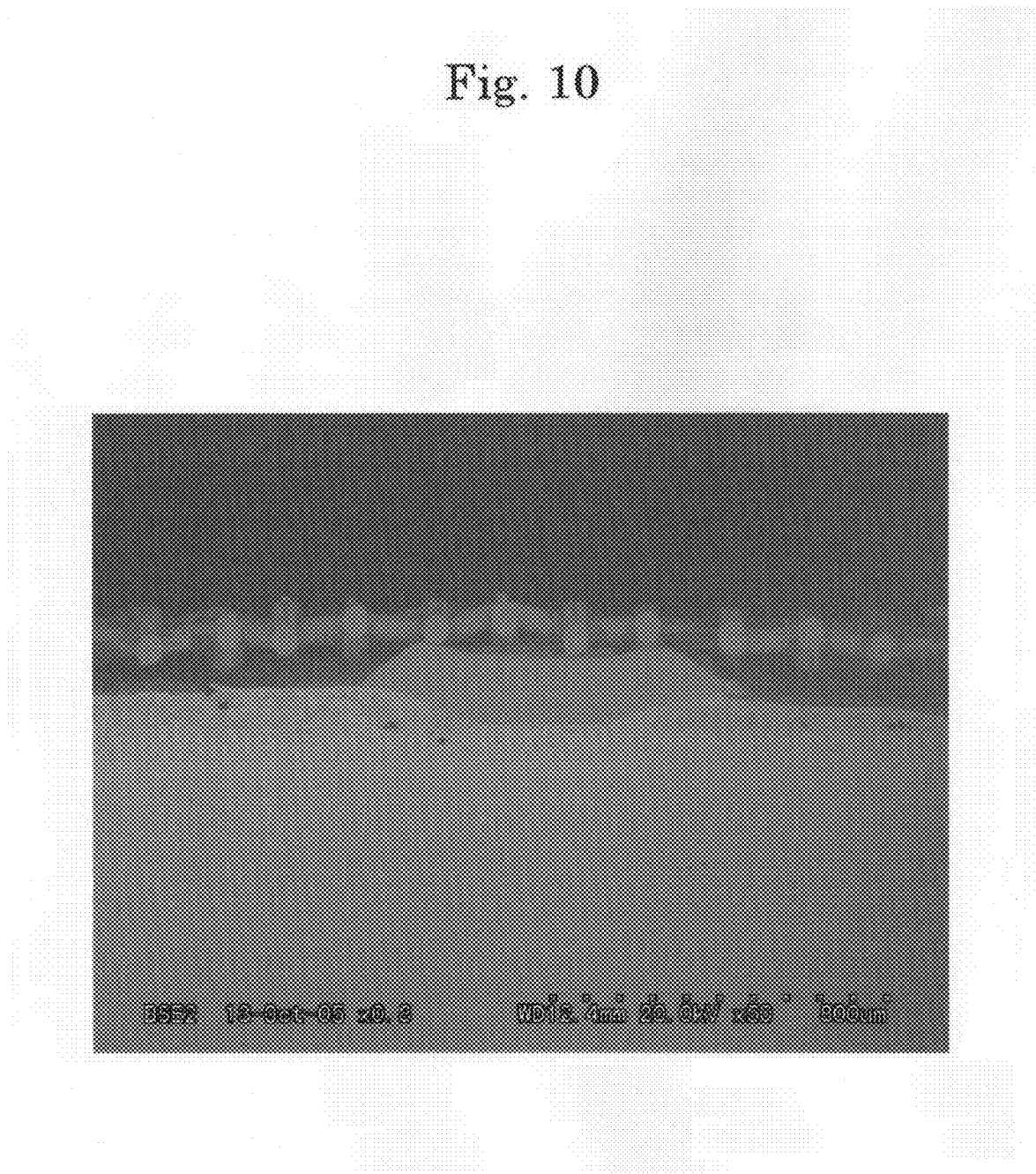
FIG. 10 is a photograph showing a section of the device constructed in Example 1.

Further, the appearance of the device constructed in Example 1 is shown in FIG. 9, and a cross-section thereof is shown in FIG. 10. As shown in FIG. 9, the net-shaped second conductive reinforcing layer is exposed on the device surface. As shown in FIG. 10, the underlying layer is formed on the laminated body surface, and the first conductive reinforcing layer is protruding from the underlying layer through the conductive material, and the second conductive reinforcing layer is bonded thereto. There is a gap between the second conductive reinforcing layer and the joining material.

Figure 11:
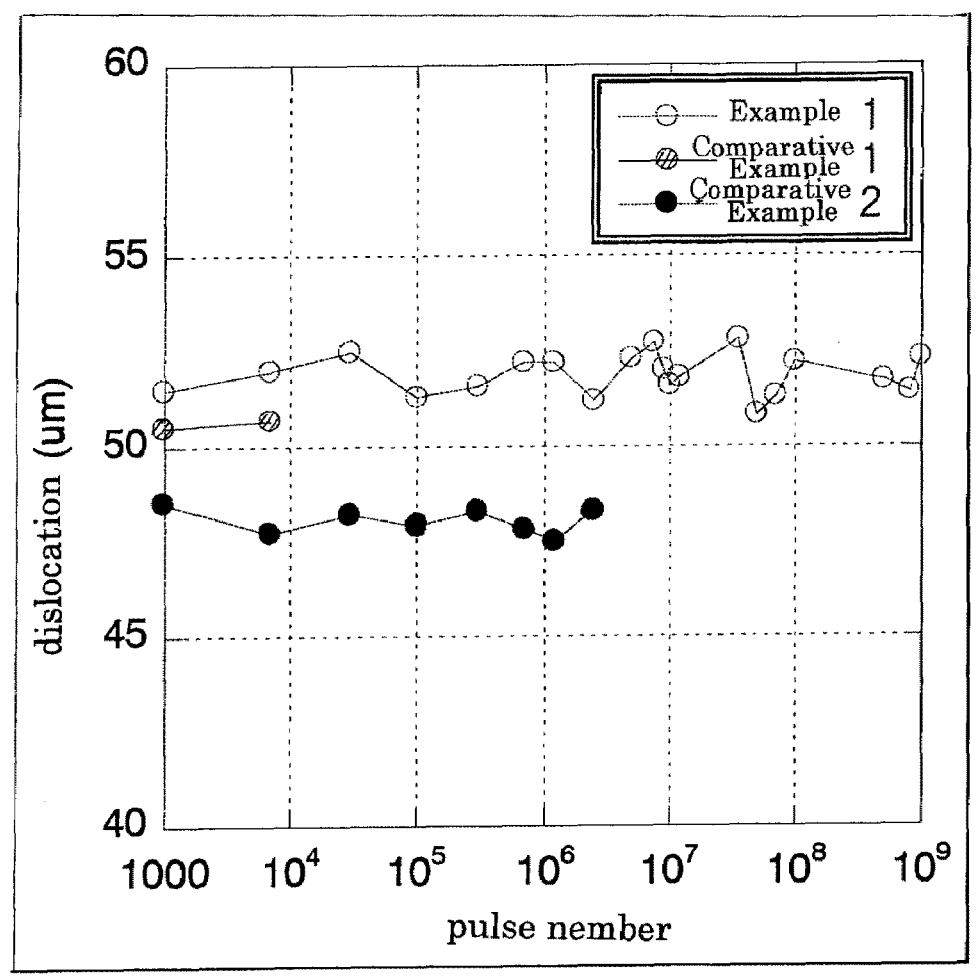
FIG. 11 is a graphic representation of the relations between number of actuation cycles and actuator displacement for the devices of Example 1 and Comparative Examples 1 and 2.

FIG. 11 is a graphic representation of the relations between number of actuation cycles and actuator displacement for the devices of Example 1 and Comparative Examples 1 and 2.

The present invention has been explained referring to the preferred embodiments, however, the present invention is not limited to the illustrated embodiments which are given by way of examples only, and may be carried out in various modifications and changes without departing from the scope of the attached claims.

The invention claimed is:

1. A multilayer piezoelectric device comprising:
    a laminated body comprising a plurality of piezoelectric layers laminated in the direction of a given axis and internal electrode layers each disposed between two respective neighboring piezoelectric layers;
    a underlying layer disposed on a side face of the laminated body and electrically connected to the internal electrode layers;
    a first conductive reinforcing layer joined to the underlying layer;
    a second conductive reinforcing layer joined to the first conductive reinforcing layer; and
    a conductive joining material joining the underlying layer and the first conductive reinforcing layer,
    wherein a gap is provided between the second conductive reinforcing layer and the conductive jointing material and the second conductive reinforcing layer is free of joining by means of the conductive joining material.

2. The piezoelectric device of claim 1, wherein the first conductive reinforcing layer and the second conductive reinforcing layer are combined with each other by welding, diffusion bonding, brazing or a conductive adhesive.

3. The piezoelectric device of claim 1, wherein the first conductive reinforcing layer comprises a sheet-shaped metal.

4. The piezoelectric device of claim 3, wherein the sheet-shaped metal comprises a flat sheet metal.

5. The piezoelectric device of claim 3, wherein the sheet-shaped metal is an expanded metal, punched metal or etched metal sheet.

6. The piezoelectric device of claim 1, wherein the second conductive reinforcing layer comprises a net.

7. The piezoelectric device of claim 1, wherein the first conductive reinforcing layer comprises at least one metal selected from the group consisting of Ni, Cu, Fe, Cr, Ti, Mg, Al, Ag, Pd, Pt, Au and the alloys thereof.

8. The piezoelectric device of claim 1, wherein the second conductive reinforcing layer comprises at least one metal selected from the group consisting of Ni, Cu, Fe, Cr, Ti, Mg, Al, Ag, Pd, Pt, Au and the alloys thereof.

9. The piezoelectric device of claim 6, wherein the first conductive reinforcing layer has a percentage open area larger than that of the second conductive reinforcing layer.

10. The piezoelectric device of claim 1, wherein the conductive joining material has an area greater than that of the first conductive reinforcing layer.

11. The piezoelectric device of claim 1, wherein the conductive joining material comprises at least one metal selected from the group consisting of Sn, Pb, Cu, Ag, Au, In, Ga and Al.

12. The piezoelectric device of claim 1, wherein the conductive joining material comprises an organic adhesive containing a conductive substance.

13. The piezoelectric device of claim 1, wherein 10% to 80% of the surface area of the first conductive reinforcing layer is in contact with the conductive joining material.

14. The piezoelectric device of claim 6, wherein the first conductive reinforcing layer is joined to the second conductive reinforcing layer at points of intersection of the first conductive reinforcing layer.

15. The piezoelectric device of claim 1, for use as a driving source for actuating an injection nozzle opening/closing mechanism in an internal engine fuel injection system.

* * * * *